United States Patent [19]

Serikawa et al.

[11] Patent Number: 4,751,739
[45] Date of Patent: Jun. 14, 1988

[54] APPARATUS AND METHOD FOR CONTROLLING TONE QUALITY

[75] Inventors: Mitsuhiko Serikawa; Akihisa Kawamura; Hiroyuki Takewa; Katsuaki Sato, all of Osaka, Japan

[73] Assignee: Matsushita Electric Industrial Co., Ltd., Japan

[21] Appl. No.: 921,768

[22] Filed: Oct. 22, 1986

[30] Foreign Application Priority Data

Oct. 23, 1985 [JP] Japan ................... 60-236656

[51] Int. Cl.[4] ............................................. H03G 5/00
[52] U.S. Cl. ..................................... 381/103; 364/725
[58] Field of Search ......................... 381/98, 101, 103; 364/725

[56] References Cited

U.S. PATENT DOCUMENTS

| 4,316,060 | 2/1982 | Adams et al. | 381/98 |
| 4,458,362 | 7/1984 | Berkovitz et al. | 381/101 |
| 4,628,530 | 12/1986 | Op De Beek et al. | 381/103 |

Primary Examiner—Forester W. Isen
Attorney, Agent, or Firm—Lowe, Price, LeBlanc, Becker & Shur

[57] ABSTRACT

A digital signal represents a desired amplitude frequency characteristic. A desired transmission characteristic is derived from the desired amplitude frequency characteristic. A sound signal is processed in accordance with the desired transmission characteristic. The processed sound signal is converted by a speaker into corresponding sound. The process of the sound signal corrects and compensates for the original sound pressure frequency characteristic of the speaker and thereby actualizes the desired amplitude frequency characteristic.

9 Claims, 4 Drawing Sheets

APPARATUS AND METHOD FOR CONTROLLING TONE QUALITY

BACKGROUND OF THE INVENTION

1. Field of the Invention

This invention relates generally to a tone quality control apparatus, and specifically to a digital tone control apparatus using digital signal processing. This invention also relates to a method of controlling tone quality.

2. Description of the Prior Art

Recently, digital signal processing technics have remarkably entered the field of sound. Especially in the field of hall sound, finer sound making or generation has been performed by development of digital mixers, digital equalizers, or other digital devices.

Some speaker systems have their own channel dividers and perform primitive unit correction in addition to the channel division. Such techniques have also advanced sound control in hall sound systems.

In some conventional hall sound systems, audio or musical signals inputted via microphones are mixed and converted by a mixer into a mixed sound signal, which is fed to an equalizer. The equalizer performs filtering of the sound signal at an adjustable frequency characteristic. This filter characteristic is generally adjusted in accordance with a frequency characteristic of a hall and a frequency characteristic of a sound reproducing speaker system. An output sound signal from the equalizer is applied to a channel divider. The channel divider separates the inputted sound signal into plural bands and thus derives plural sound signals corresponding to the respective bands. The channel divider generally includes analog filters for the band division. The band-divided sound signals are fed to power amplifiers respectively. After amplification by the power amplifiers, these sound signals are inputted into respective units of the speaker system, such as a tweeter, a mid-range, and a woofer. The units of the speaker system convert the respective sound signals into corresponding sounds.

In these conventional sound systems, adjustment of the filter characteristic of the equalizer and adjustment of characteristics of the filters in the channel divider allow a frequency characteristic of sound reproduction to vary. Since the filters in the channel divider are of the analog type and also the equalizer is of the analog type, this allowable variation in the frequency characteristic is generally broad and gentle and, usually, frequency characteristics of the respective bands can not be varied independently even when the equalizer has a ⅓ octave band-width. Therefore, it is generally difficult to flat or compensate sharp peaks and dips in the original sound pressure frequency characteristics of the respective units of the speaker system. It should be noted that such peaks and dips in the frequency characteristic cause a problem in aural sensation.

Advanced hall sound systems use an accurate digital equalizer. Usually, it takes a long time to set or adjust the digital equalizer to optimize the frequency characteristic.

SUMMARY OF THE INVENTION

It is an object of this invention to provide apparatus and method for controlling tone quality which can flat or compensate sharp peaks and dips in the original sound pressure fequency characteristic of a speaker system.

It is another object of this invention to provide easily adjustable apparatus and method for controlling tone quality.

In accordance with this invention, a digital signal representative of a desired amplitude frequency characteristic is generated. A desired transmission characteristic is derived from the desired amplitude frequency characteristic. A sound signal is processed in accordance with the desired target transmission characteristic.

DESCRIPTION OF THE PREFERRED EMBODIMENT

Figure 1:
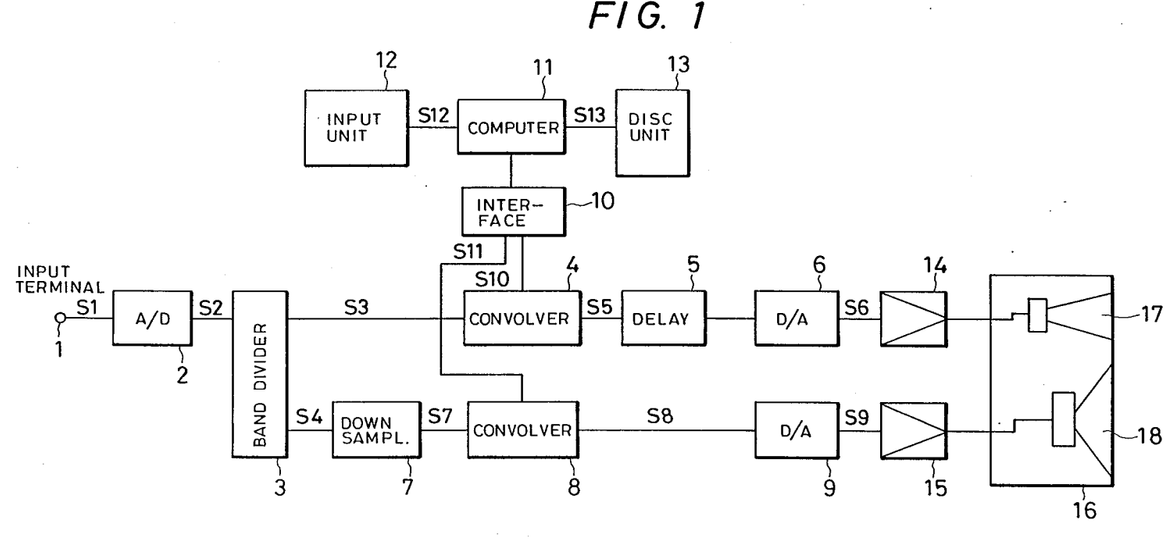
FIG. 1 is a block diagram of a sound system including a tone quality control apparatus according to an embodiment of this invention.

With reference to FIG. 1, an input terminal 1 receives an analog audio or sound signal S1 from a device, such as a microphone, a mixer, a tape recoder, a record player, and a reference sound signal generator. An analog-to-digital (A/D) converter 2 connected to the input terminal 1 receives the analog sound signal S1 and converts it into a corresponding 12-bit digital signal S2. In the case where extremely high fidelity is desired, the digital sound signal S2 may have 16 bits or more. The frequency of sampling of the input analog signal S1 in the A/D converter 2 is preferably 42 KHz. A channel or band divider 3 connected to the A/D converter 2 receives the digital sound signal S2 and divides or converts it into two digital sound signals S3 and S4 corresponding to a high frequency band (channel) and a low frequency band (channel) respectively. The band divider 3 includes an FIR (finite-duration impulse response) digital filter of the linear phase shift type.

A convolver 4 connected to the band divider 3 receives the high band digital signal S3. The convolver 4 processes the digital signal S3 through controllable real time convolution and thereby derives a modified high band digital signal S5. A delay section 5 connected to the convolver 4 delays the high band digital signal S5 by a preset interval of time. A digital-to-analog (D/A) converter 6 connected to the delay section 6 receives the delayed high band digital signal S5 and converts it into a corresponding high band analog signal S6. An amplifier 14 connected to the D/A converter 6 receives the high band sound signal S6 and amplifies it. A speaker system 16 includes a tweeter 17 connected to the amplifier 14. The tweeter 17 receives the amplified high band sound signal S6 and converts it into corresponding sound.

A down sampling section 7 connected to the band divider 3 receives the low band digital signal S4. The down sampling section 7 thins out the low band digital signal and thus derives a thinned low band digital signal S7 by sampling the signal S4 at a frequency lower than the sampling frequency in the A/D converter 2. The sampling frequency in the down sampling section 7 is preferably 5.25 KHz. A convolver 8 connected to the down sampling section 7 receives the thinned low band digital signal S7. The convolver 8 processes the low band digital signal S7 through controllable real time convolution and thereby derives a modified low band digital signal S8. A digital-to-analog (D/A) converter 9 connected to the convolver 8 receives the low band digital signal S8 and converts it into a corresponding low band analog signal S9. An amplifier 15 connected to the D/A converter 9 receives the low band sound signal S9 and amplifies it. The speaker system includes a woofer 18 connected to the amplifier 15. The woofer 18 receives the low band sound signal S9 and converts it into corresponding sound.

The convolvers 4 and 8 include controllable FIR digital filters processing the high band digital signal S3 and the low band digital signal S7 respectively. The filter characteristics of the convolvers 4 and 8 are adjusted via digital control signals S10 and S11 applied to their control terminals respectively. Specifically, tap coefficients in the filtering convolutions by the convolvers 4 and 8 are adjusted via the control signals S10 ans S11. As will be made clear hereinafter, the adjustment of the filter characteristics of the convolvers 4 and 8 are designed so as to actualize operator's demand for a desired frequency characteristic of sound reproduction via the speaker system 16 by compensating for the original sound pressure frequency characteristic of the speaker system 16. Thus, the desired frequency characteristic of sound reproduction is actualized independent of the original sound pressure frequency characteristic of the speaker system 16.

The process of the low band digital signal S4 in the down sampling section 7 causes a phase difference between the high band digital signal S5 and the low band digital signal S8 outputted by the convolvers 4 and 8. Since the periods of the digital signals S5 and S8 are approximately 24 $\mu$sec and 190 $\mu$sec respectively, the phase difference between the signals S5 and S8 equals a value corresponding to a time interval of approximately 166 $\mu$sec. The positional relationship between the tweeter 17 and the woofer 18 can cause a phase difference between the high band sound generated by the tweeter 17 and the low band sound generated by the woofer 18. The retardation of the high band signal S5 by the delay section 5 is chosen so as to compensate for these phase differences and thereby to match the phase of the sound from the tweeter 17 and the phase of the sound from the woofer 18.

As described previously, the down sampling section 7 thins out the low band digital sound signal S4 by sampling it at a frequency lower than the sampling frequency in the A/D converter 2, so that the frequency of digital signal processing in the low frequency band is lower than the frequency of digital signal processing in the high frequency band. This variation in the processing frequency with the bands can improve the accuracy of low band correction in aural sensation.

An input unit 12 includes a manual setting section having a key arrangement or other manually adjustable input devices. The operator handles and sets the input section 12 in accordance with operator's demand for a desired frequency characteristic of sound reproduction, that is, a target sound pressure or amplitude frequency characteristic. The input unit 12 generates and outputs a digital signal S12 representing the target amplitude frequency characteristic. A computer 11 connected to the input unit 12 receives the target characteristic signal S12. A memory disc unit 13 holds a data base including transmission characteristics (impulse characteristics) of the tweeter 17 and the woofer 18. The disc unit 13 outputs a digital signal S13 representing these transmission characteristics of the speakers 17 and 18. The transmission characteristic signal S13 is fed to the computer 11 via a connection between the unit 13 and the computer 11. The control terminals of the convolvers 4 and 8 are connected to the computer 11 by way of an interface 10. The computer 11 calculates or determines target filter characteristics of the convolvers 4 and 8 in accordance with the target amplitude frequency characteristic derived from the signal S12 and also with the transmission characteristics of the speakers 17 and 18 derived from the signal S13. The computer 11 controls or orders the interface 10 to output the signals S10 and S11, representing the target filter characteristics, to the convolvers 4 and 8 respectively. The target filter characteristics of the convolvers 4 and 8 are designed so as to compensate for the original sound pressure frequency characteristic of the speaker unit 16 and as to actualize the desired frequency characteristic of sound reproduction via the speaker unit 16.

Figure 2:
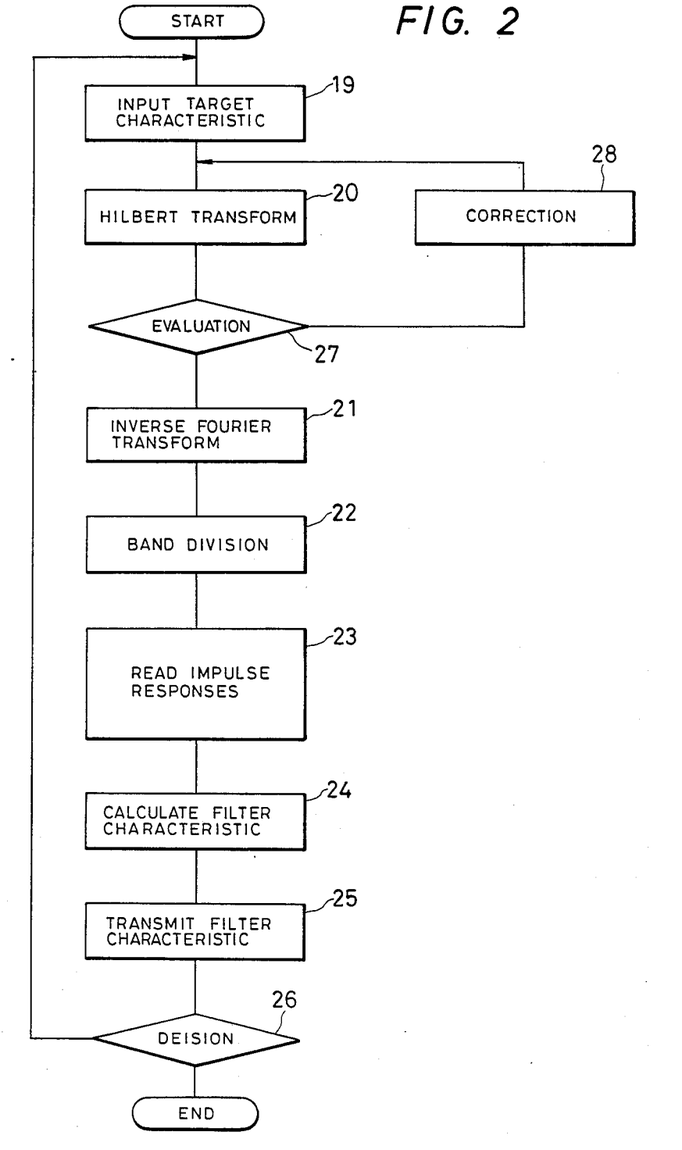
FIG. 2 is a flowchart of a program operating the computer in FIG. 1.

The computer 11 operates in accordance with a program stored in a memory, such as a read-only memory, within the computer 11. FIG. 2 is a flowchart of the program, i.e., a flowchart of operation of the computer 11.

As shown in FIG. 2, when the operator sets and inputs a target amplitude frequency characteristic into the input unit 12, the computer 11 reads or derives the target amplitude frequency characteristic from the signal S12 in a first step 19.

In steps 20, 27, and 28 following the step 19, the computer 11 derives a target transmission characteristic from the target amplitude frequency characteristic through approximation or successive approximation including Hilbert transformation.

Specifically, after the step 19, the program advances to the step 20 in which the target amplitude frequency characteristic is regarded as or supposed to be a first order real part characteristic of a target transmission characteristic. A first order imaginary part characteristic of the target transmission characteristic is derived by Hilbert-transforming the first order real part characteristic. A first approximate transmission characteristic is derived from the first order real part characteristic and the first order imaginary part characteristic. After the step 20, the program advances to the step 27.

In the step 27, an amplitude frequency characteristic is counter calculated from the first approximate transmission characteristic determined in the preceding step 20. The calculated amplitude frequency characteristic is compared with the target amplitude frequency characteristic, and the gain or level difference between these two amplitude frequency characteristics is calculated and evaluated. When the gain difference resides in a preset unacceptable range, that is, when the gain difference is evaluated to be unacceptable, the program advances to the step 28. When the gain difference resides in a preset acceptable range, that is, when the gain difference is evaluated to be acceptable, the program advances to a step 21.

In the step 28, the first order real part characteristic is corrected in accordance with the gain difference between the calculated amplitude frequency characteristic and the target amplitude frequency characteristic determined in the preceding step 27. After the step 28, the program returns to the step 20.

In the step 20 following the step 28, the corrected first order real part characteristic determined in the preceding step 28 is regarded as or supposed to be a second order real part characteristic of the target transmission characteristic. A second order imaginary part characteristic of the target transmission characteristic is derived by Hilbert-transforming the second order real part characteristic. A second approximate transmission characteristic is derived from the second order real part characteristic and the second order imaginary part characteristic. After the step 20, the program advances to the step 27.

In the step 27, an amplitude frequency characteristic is counter calculated from the second approximate transmission characteristic determined in the preceding step 20. The calculated amplitude frequency characteristic is compared with the target amplitude frequency characteristic, and the gain or level difference between these two amplitude frequency characteristics is calculated and evaluated. When the gain difference resides in the unacceptable range, that is, when the gain difference is evaluated to be unacceptable, the program advances to the step 28. When the gain difference resides in the acceptable range, that is, when the gain difference is evaluated to be acceptable, the program advances to the step 21.

In the step 28, the second order real part characteristic is corrected in accordance with the gain difference between the calculated amplitude frequency characteristic and the target amplitude frequency characteristic determined in the preceding step 27. After the step 28, the program returns to the step 20.

In the step 20 following the step 28, the corrected second order real part characteristic determined in the preceding step 28 is regarded as or supposed to be a third order real part characteristic of the target transmission characteristic. A third order imaginary part characteristic of the target transmission characteristic is derived by Hilbert-transforming the third order real part characteristic. A third approximate transmission characteristic is derived from the third order real part characteristic and the third order imaginary part characteristic. After the step 20, the program advances to the step 27.

In the step 27, an amplitude frequency characteristic is counter calculated from the third approximate transmission characteristic determined in the preceding step 20. The calculated amplitude frequency characteristic is compared with the target amplitude frequency characteristic, and the gain or level difference between these two amplitude frequency characteristics is calculated and evaluated. When the gain difference resides in the unacceptable range, that is, when the gain difference is evaluated to be unacceptable, the program advances to the step 28. When the gain difference resides in the acceptable range, that is, when the gain difference is evaluated to be acceptable, the progam advances to the step 21.

As the number of times of repeat of the approximation in the steps 20, 27, and 28 increases, that is, as the successive approximation progresses, the amplitude frequency characteristic included in the resulting approximate transmission characteristic is closer to the target amplitude frequency characteristic. Accordingly, in general, the gain difference between the calculated and target amplitude frequency characteristics becomes acceptable and thus the program moves from the step 27 to the step 21 after the approximation is repeated several times.

Figure 3:
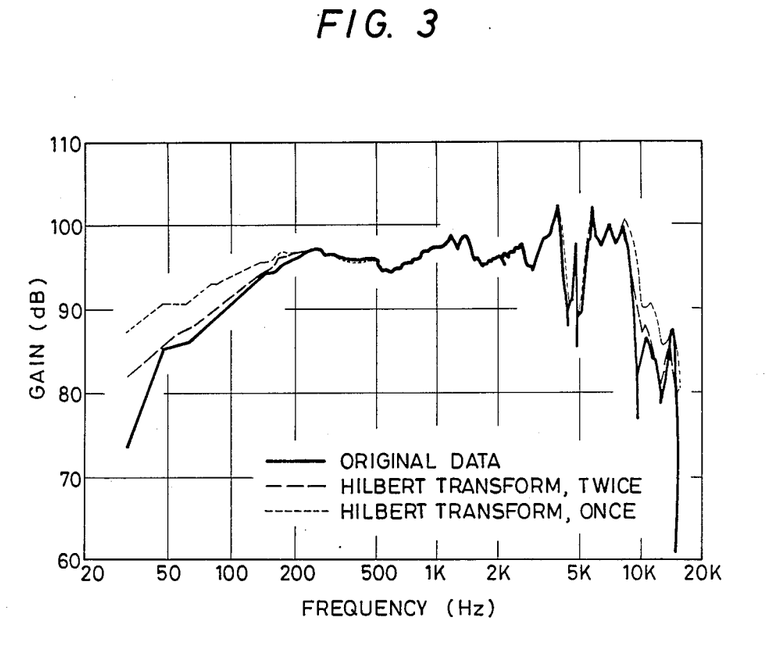
FIG. 3 is a diagram showing amplitude frequency characteristics derived in the tone quality control apparatus of FIG. 1.

FIG. 3 shows amplitude frequency characteristics obtained by the approximation process of this invention. As shown in FIG. 3, the amplitude frequency characteristic obtained by the approximation performing Hibert transformation twice is closer to the original inputted amplitude frequency characteristic of a 16 cm-diameter cone speaker than the amplitude frequency characteristic obtained by the approximation performing Hilbert transformation once is.

It should be noted that the step 27 may be modified so as to repeat the approximation a preset number of times. In this case, the program continues to move from the step 27 to the step 28 until the number of repeat of the approximation reaches a preset number. The program moves from the step 27 to the step 21 when the number of repeat of the approximation reaches the preset number.

In the step 21, the final approximate transmission characteristic determined in the step 20 is regarded as or supposed to be the target transmission characteristic. In other words, the final approximate transmission characteristic is used as the target transmission characteristic. The target transmission characteristic equal to the final approximate transmission characteristic is converted into corresponding time series data through inverse Fourier transformation.

In a step 22 following the step 21, the time series data is divided into two components corresponding to a high frequency band or part of the target transmission characteristic and a low frequency band or part of the target transmission characteristic respectively. This band division is designed to match the band or channel division of the digital sound signal S2 by the band divider 3.

In a step 23 following the step 22, the computer 11 reads or derives the transmission characteristic (impulse characteristic) of the tweeter 17 and the transmission characteristic (impulse characteristic) of the woofer 18 from the signal S13 outputted by the disc unit 13.

In a step 24 following the step 23, the computer 11 derives high band tap coefficients from the target high band transmission characteristic and the transmission characteristic of the tweeter 17 determined in the previous steps 22 and 23. The high band tap coefficients determine a target high band filter characteristic. The high band tap coefficients are designed so that the transmission characteristic of the tweeter 17 can be converted into or corrected to the target high band transmission characteristic through convolution with these tap coefficients. In addition, the computer 11 derives low band tap coefficients from the target low band transmission characteristic and the transmission characteristic of the woofer 18 determined in the previous steps 22 and 23. The low band tap coefficients determine a target low band filter characteristic. The low band tap coefficients are designed so that the transmission characteristic of the woofer 18 can be converted into or corrected to the target low band transmission characteristic through convolution with these tap coefficients.

In a step 25 following the step 24, the signal S10 representing the target high band filter characteristic (the high band tap coefficients) determined in the step 24 is outputted to the convolver 4 by way of the interface 10. In addition, the signal S11 representing the target low band filter characteristic (the low band tap coefficients) determinded in the step 24 is outputted to the convolver 8 by way of the interface 10.

Thus, the convolver 4 processes the high band digital signal S3 through convolution with the target high band filter characteristic (the high band tap coefficients), so that the original sound pressure frequency characteristic of the tweeter 17 is compensated or corrected and the resulting or actual frequency characteristic of sound reproduced by the tweeter 17 essentially equals a high frequency part of the target amplitude frequency characteristic manually inputted by the operator. In addition, the convolver 8 processes the low band digital signal S7 through convolution with the target low band filter characteristic (the low band tap coefficients), so that the original sound pressure frequency characteristic of the woofer 18 is compensated or corrected and the resulting or actual frequency characteristic of sound reproduced by the woofer 17 essentially equals a low frequency part of the target amplitude frequency characteristic manually inputted by the operator.

Usually, after audition or test operation of the sound system is performed under these conditions of filtering convolutions, the operator handles the input unit 12 and inputs an instruction signal representing whether or not change of the target amplitude frequency characteristic is required. When the operator inputs the instruction signal representing that change of the target amplitude frequency characteristic is required, the operator sets and inputs a new amplitude frequency characteristic into the input unit 12.

In a step 26 following the step 25, the computer 11 decides or detects whether or not change of the target amplitude frequency characteristic is required by referring to the instruction signal from the input unit 12. When change of the target characteristic is not required, the program ends. When change of the target characteristic is required, the program returns to the step 19. In the latter case, the steps 19–28 repeat again so that the filter characteristics of convolutions in the convolvers 4 and 8 are determined on the basis of the new target amplitude frequency characteristic. In this way, the frequency characteristic of sound reproduction via the speaker unit 16 can be changed easily in a short time.

The convolvers 4 and 8 have similar internal structures. Only one of the convolvers 4 and 8 will be described in more detail hereinafter, and detailed description of the other convolver is omitted.

Figure 4:
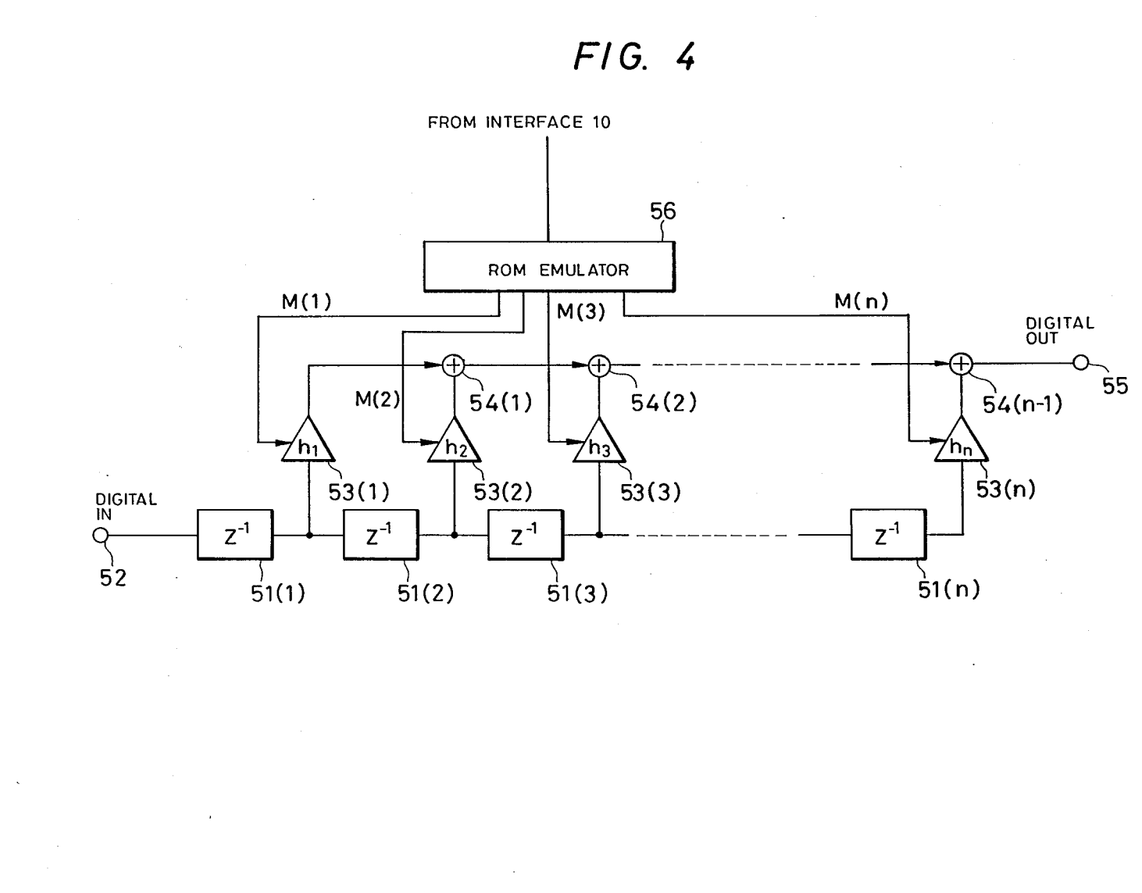
FIG. 4 is a block diagram of an internal design of the convolver in FIG. 1.

As shown in FIG. 4, the convolver 4 has a series combination of delay elements 51(1), 51(2), 51(3), ..., 51(n) where n is a peset number. An end of the combination of the delay elements 51(1)–51(n) is connected to an input terminal 52 of the convolver 4 which receives the high band digital signal S3 (see FIG. 1). Input terminals of multipliers 53(1), 53(2), 53(3), ..., 53(n−1) are connected to taps between the delay elements 51(1)–51(n) respectively. An input terminal of a final multiplier 53(n) is connected to the output terminal of the final delay element 51(n), that is, the other end of the combination of the delay elements 51(1)–51(n). Adders 54(1), 54(2), 54(3), ..., 54(n−1) are connected in series. The output terminals of the adder 54(1)–54(n−2) are connected to first input terminals of the following adders 54(2)–54(n−1) respectively. The output terminal of the first multiplier 53(1) is connected to the first input terminal of the first adder 54(1). The output terminal of the final adder 54(n−1) is connected to an output terminal 55 of the convolver 4 via which the processed high band digital signal S5 (see FIG. 1) travels. The output terminals of the multipliers 53(2)–53(n) are connected to second input terminals of the adders 54(1)–54(n−1) respectively. A ROM emulator 56 generates signals M(1), M(2), M(3), ..., M(n) representing multiplication coefficients $h_1, h_2, h_3, \ldots, h_n$ respectively. The emulator 56 connected to control terminals of the multipliers 53(1)–53(n) so that the signals M(1)–M(n) are applied to the control terminals of the multipliers 53(1)–53(n) respectively. The values represented by the delayed signals coming to the multipliers 53(1), ..., (53(n) from the corresponding taps and the end of the combination of the delay elements 51(1)–51(n) are multiplied by the coefficients $h_1, \ldots, h_n$ respectively. The values represented by the output signals from the multipliers 53(1)–53(n) are summed up by the adders 54(1)–54(n−1), resulting in the indication of the processed signal S5 applied to the output terminal 55 of the convolver 4. The emulator 56 adjustably determines the multiplication coefficients $h_1, \ldots, h_n$. The emulator 56 is connected to the interface 10 (see FIG. 1) to receive the control signal S10. The emulator 56 is controllable via the signal S10. Control of the emulator 56 via the signal S10 allows the multiplication coefficients $h_1, \ldots, h_n$ to vary. In other words, the multiplication coefficients $h_1, \ldots, h_n$ are determined in accordance with the control signal S10. It should be noted that the control signal S10 represents the desired high band tap coefficients which have a preset relationship with the multiplication coefficients. Accordingly, the multiplication coefficients are determined in accordance with the tap coefficients.

Various values of each of the multiplication coefficients $h_1, \ldots, h_n$ are prestored in the emulator 56. The emulator 56 selects and uses one set of the values of the multiplication coefficients $h_1, \ldots, h_n$ in accordance with the control signal S10. When the target amplitude frequency characteristic is changed by handling the input unit 12 (see FIG. 1), the computer 11 (see FIG. 1) calculates new target tap coefficients in accordance with the change of the target amplitude frequency characteristic and the control signal S10 representative of the new tap coefficients is outputted via the interface 10 (see FIG. 1) to the emulator 56. At this time, the emulator 56 changes the mutiplication coefficients or selects a new set of the values of the multiplication coefficients in accordance with the new tap coefficients represented by the control signal S10. The eumlator 56 holds the selected multiplication coefficients unchanged as long as there is no requirement for another change of the multiplication coefficients via the control signal S10.

As described previously, the internal structure of the convolver 8 is similar to that of the convolver 4. In the convolver 8, a ROM emulator receives the control signal S11 from the interface 10 (see FIG. 1). The input terminal of the convolver 8 receives the low band digital signal S7. The convolver 8 processes the low band digital signal S7 in accordance with the control signal S11. Detailed operation of the convolver 8 is similar to that of the convolver 4. The convolver 8 generates the processed low band digital signal S8 via its output terminal.

It should be noted that modifications may be made in this invention. For example, while the number of divided bands is two in the previously-mentioned embodiment, the number of divided bands may be three or more. In addition, the data base stored in the disc unit 13 may include various amplitude frequency characteristics, and the target amplitude frequency characteristic may be selected from these characteristics in the data base in compliance with operator's requirement.

What is claimed is:

1. A tone quality control apparatus comprising:
   (a) means for generating a digital signal representing a desired amplitude frequency characteristic;
   (b) means, responsive to the digital signal, for deriving a desired transmission characteristic from the desired amplitude frequency chatacteristic; and
   (c) means for processing a sound signal in accordance with the desired transmission characteristic,
   said deriving means comprising means for Hilbert-transforming the desired amplitude frequency characteristic into a transformed characteristic, and means for determining the desired transmission characteristic on the basis of the desired amplitude frequency characteristic and the transformed characteristic.

2. The tone quality control apparatus of claim 1 wherein the generating means comprises a manually adjustable input unit, and the desired amplitude frequency characteristic is varied in accordance with adjustment of the input unit.

3. The tone quality control apparatus of claim 1 wherein the generating means comprises a disc unit holding various amplitude frequecy characteristics, from which the desired amplitude frequency characteristic is selected.

4. The tone quality control apparatus of claim 1 wherein the sound signal is digital, and the processing means comprises means for processing the digital sound signal through convolution with an adjustable filter characteristic and means for adjusting the filter characteristic in accordance with the desired transmission characteristic.

5. The tone quality control apparatus of claim 1 further comprising means for dividing the sound signal into frequency bands, and means for dividing the desired transmission characteristic into frequency bands corresponding to the bands of the sound signal, and wherein the processing means is operative to process the band-divided sound signals in accordance with the band-divided transmission characteristics.

6. The tone quality control apparatus of claim 1 wherein the deriving means further comprises means for regarding the desired amplitude frequency characteristic as a real part characteristic of the desired transmission characteristic, said means for Hilbert-transforming operable for transforming the real part characteristic and thereby deriving an imaginary part characteristic of the desired transmission characteristic, means for deriving an approximate transmission characteristic from the real part and imaginary part characteristics, means for counter calculating an amplitude frequency characteristic from the approximate transmission characteristic, means for calculating a difference between the desired amplitude characteristic and the counter calculated amplitude frequency characteristic, means for correcting the real part characteristic in accordance with the difference, means for Hilbert-transforming the corrected real part characteristic and thereby deriving a corrected imaginary part characteristic, means for deriving a second approximate transmission characteristic from the corrected real part and imaginary part characteristics, and means for deriving the desired transmission characteristic from the second approximate transmission charcteristic.

7. A tone quality control apparatus comprising:
   (a) means for generating a digital signal representing a desired amplitude frequency characteristic;
   (b) means, responsive to the digital signal, for deriving a desired transmission characteristic from the desired amplitude frequency characteristic; and
   (c) means for processing a sound signal in accordance with the desired transmission characteristic,
   wherein the desired transmission characteristic is derived from the desired amplitude frequency characteristic through successive approximation in which said amplitude frequency characteristic is regarded as a real part characteristic of the desired transmission characteristic and in which Hilbert transformation deriving an imaginary part characteristic of the desired transmission characteristic from the real part characteristic of the desired transmission characteristic is performed at least once.

8. A method of controlling tone quality, comprising the steps of:
   generating a digital signal representing a desired amplitude frequency characteristic;
   deriving a desired transmission characteristic from the desired amplitude frequency characteristic; and
   processing a sound signal in accordance with the desired transmission characteristic,
   said deriving step comprising:
   (a) regarding the target amplitude frequency characteristic as a real part characteristic of the desired transmission characteristic;
   (b) Hilbert-transforming the real part characteristic and thereby deriving an imaginary part characteristic;
   (c) deriving an approximate transmission characteristic from the real and imaginary part characteristics;
   (d) counter calculating an amplitude frequency characteristic from the approximate transmission characteristic;
   (e) deriving a difference between the desired amplitude frequency characteristic and the counter calculated amplitude frequency characteristic;
   (f) deciding whether or not the difference is acceptable;
   (g) when the difference is acceptable, using the approximate transmission characteristic as the desired transmission characteristic;
   (h) when the difference is not acceptable, correcting the real part characteristic in accordance with the difference;
   (i) regarding the corrected real part characteristic as a new real part characteristic; and
   (j) in respect of the new real part characteristic, repeating the steps (b) to (i).

9. A system comprising:
   (a) means for processing a digital sound signal through convolution with an adjustable filter characteristic;
   (b) means for deriving an analog sound signal from the processed digital signal;
   (c) a speaker reproducing sound from the analog sound signal;
   (d) means for generating a second digital signal representing an original sound pressure frequency characteristic of the speaker;
   (e) means for generating a third digital signal representing a target frequency characteristic of sound reproduction via the speaker; and (f) adjusting means for adjusting the filter characteristic comprising means for Hilbert-transforming the target frequency characteristic of sound reproduction into a transformed characteristic, means for deriving a desired transmission characteristic from the target frequency characteristic of sound reproduction and the transformed characteristic, and means for controlling the filter characteristic in accordance with the original sound pressure frequency characteristic and the desired transmission characteristic.

* * * * *